(12) United States Patent
Greenwood

(10) Patent No.: US 12,058,842 B2
(45) Date of Patent: Aug. 6, 2024

(54) METHOD AND SYSTEM FOR SMALL SCALE STRUCTURES TO IMPROVE THERMAL EFFICIENCY

(71) Applicant: ARRIS Enterprises LLC, Suwanee, GA (US)

(72) Inventor: Ian Mark Greenwood, Lancashire (GB)

(73) Assignee: ARRIS Enterprises LLC, Horsham, PA (US)

(*) Notice: Subject to any disclaimer, the term of this patent is extended or adjusted under 35 U.S.C. 154(b) by 29 days.

(21) Appl. No.: 17/478,409

(22) Filed: Sep. 17, 2021

(65) Prior Publication Data

US 2022/0095485 A1    Mar. 24, 2022

Related U.S. Application Data

(60) Provisional application No. 63/080,081, filed on Sep. 18, 2020.

(51) Int. Cl.
*H05K 7/20* (2006.01)
*H04N 21/41* (2011.01)

(52) U.S. Cl.
CPC ......... *H05K 7/20409* (2013.01); *H04N 21/41* (2013.01)

(58) Field of Classification Search
CPC .. H05K 7/20409; H05K 7/2039; H04N 21/41; H04N 5/64; G06F 1/182; G06F 1/20
See application file for complete search history.

(56) References Cited

U.S. PATENT DOCUMENTS

| | | | | |
|---|---|---|---|---|
| 4,823,869 A | * | 4/1989 | Arnold | H01L 23/3677 174/16.3 |
| 6,844,054 B2 | * | 1/2005 | Whatley | H01L 23/3733 428/323 |
| 6,942,025 B2 | * | 9/2005 | Nair | H01L 23/467 174/16.3 |
| 7,077,189 B1 | * | 7/2006 | Reyzin | H01L 23/473 165/83 |
| 7,270,301 B2 | * | 9/2007 | Maurel | G02B 5/08 244/171.7 |
| 7,360,581 B2 | * | 4/2008 | Tuma | H01L 23/3733 257/E23.095 |

(Continued)

FOREIGN PATENT DOCUMENTS

| | | | |
|---|---|---|---|
| CN | 109218641 A | * | 1/2019 |
| JP | H10-256762 A | | 9/1998 |

(Continued)

OTHER PUBLICATIONS

Translation of JP-2005244014-A (Year: 2005).*

(Continued)

*Primary Examiner* — Abhishek M Rathod
(74) *Attorney, Agent, or Firm* — Panitch Schwarze Belisario & Nadel LLC

(57) ABSTRACT

Embodiments relate to a thermally protective structure that is a case or enclosure for a media communication device (e.g., a set-top box). The thermally protective structure has a plurality of structural feature formations with facets constructed in or on its outer surface to increase the surface area through which heat is dissipated.

20 Claims, 7 Drawing Sheets

(56) References Cited

U.S. PATENT DOCUMENTS

| | | | | |
|---|---|---|---|---|
| 7,556,089 | B2* | 7/2009 | Bhatti | F28D 7/024 |
| | | | | 165/80.4 |
| 7,796,389 | B2* | 9/2010 | Edmunds | F28D 15/0233 |
| | | | | 361/679.52 |
| 8,410,602 | B2* | 4/2013 | Natarajan | H01L 23/367 |
| | | | | 361/699 |
| 9,165,854 | B2* | 10/2015 | Chun | H05K 7/2039 |
| 11,089,717 | B2* | 8/2021 | Stathakis | G11B 33/1426 |
| 11,262,815 | B2* | 3/2022 | Hua | H05K 7/20409 |
| 2007/0235178 | A1* | 10/2007 | Mochizuki | F28D 15/046 |
| | | | | 165/185 |
| 2009/0303681 | A1* | 12/2009 | Tian | H01L 23/4093 |
| | | | | 361/692 |
| 2012/0120604 | A1* | 5/2012 | Hao | F28D 15/00 |
| | | | | 165/104.21 |
| 2012/0193085 | A1* | 8/2012 | Whittle | H01L 25/0655 |
| | | | | 165/185 |
| 2012/0281167 | A1* | 11/2012 | Nakatsuka | G02F 1/133615 |
| | | | | 165/185 |
| 2013/0271920 | A1 | 10/2013 | Chun et al. | |
| 2014/0027102 | A1* | 1/2014 | Antel, Jr | F28D 1/06 |
| | | | | 165/185 |
| 2015/0257308 | A1* | 9/2015 | Li | H01L 23/373 |
| | | | | 361/706 |
| 2016/0069622 | A1* | 3/2016 | Alexiou | B23P 15/26 |
| | | | | 219/76.1 |
| 2017/0164518 | A1* | 6/2017 | Morgan | G02B 6/43 |
| 2019/0277486 | A1* | 9/2019 | Nakao | F21V 29/58 |

FOREIGN PATENT DOCUMENTS

| | | | |
|---|---|---|---|
| JP | 2005-244014 A | | 9/2005 |
| JP | 2005244014 A | * | 9/2005 |

OTHER PUBLICATIONS

Translation of CN-109218641-A (Year: 2019).*
Notification of Transmittal of the International Search Report (Forms PCT/ISA/220 and PCT/ISA/210) and the Written Opinion of the International Searching Authority (Form PCT/ISA/237) issued Jan. 7, 2022, by the International Application Division Korean Intellectual Property Office in corresponding International Application No. PCT/US2021/050852. (9 pages).

* cited by examiner

METHOD AND SYSTEM FOR SMALL SCALE STRUCTURES TO IMPROVE THERMAL EFFICIENCY

TECHNICAL FIELD

Embodiments relate to a thermally protective structure that is a case or enclosure for a media communication device (e.g., a set-top box). The thermally protective structure has a plurality of structural feature formations with facets constructed in or on its outer surface to increase the surface area through which heat is dissipated.

BACKGROUND

A media communication device (e.g., a digital image processing device, a set-top box, etc.) has a processor (e.g., integrated circuit) configured to run software (e.g., an operating system) along with other circuitry to facilitate receiving, processing and transmitting signals. Generally, the processor and other circuitry of the media communication device is housed within a case. In operation, the processor generates heat that transfers into the case and dissipates from the outer surface of the case. This heat transfer can cause the temperature of the case to increase, which can damage surrounding objects, cause injury or discomfort to those touching the case, etc.

Conventional approaches for maintaining a low temperature for cases or enclosures involve the use of heat sinks, fans, vents formed in the case, etc. Yet, the current impetus is to provide media communication devices that are ever smaller in volume. Additionally, some systems benefit from the absence of any vents formed in the case. These constraints render it difficult or impossible to use conventional thermal management techniques.

The present disclosure is directed toward overcoming one or more of the above-identified problems, though not necessarily limited to embodiments that do.

SUMMARY

Embodiments relate to a thermally protective structure that is a case or enclosure for a media communication device (e.g., a set-top box). The thermally protective structure has a plurality of structural feature formations with facets constructed in or on its outer surface to increase the surface area through which heat is dissipated.

One crucial factor in the thermal efficiency of a set-top box (amongst others) is the quantification of the total amount of power to be dissipated across the total available surface area (i.e., quantification of Watts/meter$^2$). When the overall volume of the set-top box is fixed, surface area is effectively locked at the macroscopic level, but aspects of the thermally protective structure disclosed herein engineer the surface of the case or enclosure in such a way that the volume of the set-top box nominally remains the same while the surface is modified at a very small scale to enhance or increase the surface area of the case. For instance, an otherwise flat surface (e.g., a lid portion of the set-top box) can be modified by applying small surface changes in a repetitive way such that, when amortized across the entire surface, produces a significant increase in surface area.

In an exemplary embodiment, a thermally protective structure includes a barrier having an inner surface and an outer surface, the outer surface divided into a plurality of subdivision areas. A plurality of formations is constructed within each subdivision area, each formation being a structural feature constructed in or on the outer surface such that the outer surface with the plurality of formations has a surface area greater than a surface area of the outer surface without the plurality of formations.

In some embodiments, the plurality of formations within each subdivision area forms a pattern that is repeated throughout every subdivision area.

In some embodiments, at least a portion of a formation is raised from the outer surface.

In some embodiments, at least a portion of a formation is recessed within the outer surface.

In some embodiments, the plurality of facets for each formation provides for a wedge-shaped formation.

In some embodiments, the plurality of facets for each formation provides for a pyramid-shaped formation.

In some embodiments, each subdivision area has a first formation, a second formation, a third formation, and a fourth formation. Each formation is wedge-shaped having an incline plane facet that extends up from the outer surface and leads to an apex, a back-end facet that extends from the apex to the outer surface; a first side facet; and a second side facet.

In some embodiments, at least one back-end facet extends down at an angle that is normal to a geometric flat plane of the outer surface.

In some embodiments, at least one back-end facet extends down at an angle that is non-normal to a geometric flat plane of the outer surface.

In some embodiments, at least one first side facet and at least one of the second side facet extends down at an angle that is normal to a geometric flat plane of the outer surface.

In some embodiments, at least one first side facet and at least one second side facet extends down at an angle that is non-normal to a geometric flat plane of the outer surface.

In some embodiments, the incline plane facet of the first wedge-shaped formation at the point where it meets the outer surface is adjacent a second side facet of the second wedge-shaped formation. The incline plane facet of the second wedge-shaped formation at the point where it meets the outer surface is adjacent the second side facet of the third wedge-shaped formation. The incline plane facet of the third wedge-shaped formation at the point where it meets the outer surface is adjacent the second side facet of the fourth wedge-shaped formation. The incline plane facet of the fourth wedge-shaped formation at the point where it meets the outer surface is adjacent the second side facet of the first wedge-shaped formation.

In some embodiments, the plurality of formations provide a touch area defined by an interface between an object and at least one formation the object makes physical contact with. The touch area is less than the surface area of the outer surface without the plurality of formations.

In some embodiments, each subdivision area has a first formation, a second formation, a third formation, and a fourth formation. Each formation is wedge-shaped having an incline plane facet that extends up from the outer surface and leads to an apex, a back-end facet that extends from the apex to the outer surface; a first side facet; and a second side facet. The plurality of formation provide a touch area defined by an interface between an object and at least one formation the object makes physical contact with. The interface between the object and at least one formation the object makes physical contact with consists essentially of the apexes of the plurality of formation.

In an exemplary embodiment, an enclosure for a media communication device includes a case configured to house a processor that generates heat when in operation, the case having an inner surface and an outer surface, the outer surface divided into a plurality of subdivision areas. A plurality of formations is constructed within each subdivision area, each formation being a structural feature constructed in or on the outer surface such that the outer surface with the plurality of formations has a surface area greater than a surface area of the outer surface without the plurality of formations.

In some embodiments, the inner surface is configured to face a processor of the media communication device and the outer surface has a surface area through which heat transferring from the processor and into the case is dissipated.

In an exemplary embodiment, a method for providing thermal protection involves positioning a barrier adjacent a heat source, the barrier having an inner surface and an outer surface, the inner surface facing the heat source. The outer surface is divided into a plurality of subdivision areas. A plurality of formations is constructed within each subdivision area, each formation being a structural feature constructed in or on the outer surface such that the outer surface with the plurality of formations has a surface area greater than a surface area of the outer surface without the plurality of formations. The method involves allowing heat from the heat source to transfer into the barrier via the inner surface and dissipate via the outer surface.

In some embodiments, the method involves repeating a formation pattern within a subdivision area throughout every subdivision area.

In some embodiments, at least a portion of a formation is raised from the outer surface.

In some embodiments, at least a portion of a formation is recessed within the outer surface.

Additional features, aspects, objects, advantages, and possible applications of the present disclosure will become apparent from a study of the exemplary embodiments and examples described below, in combination with the Figures, and the appended claims.

DETAILED DESCRIPTION

Figure 1:
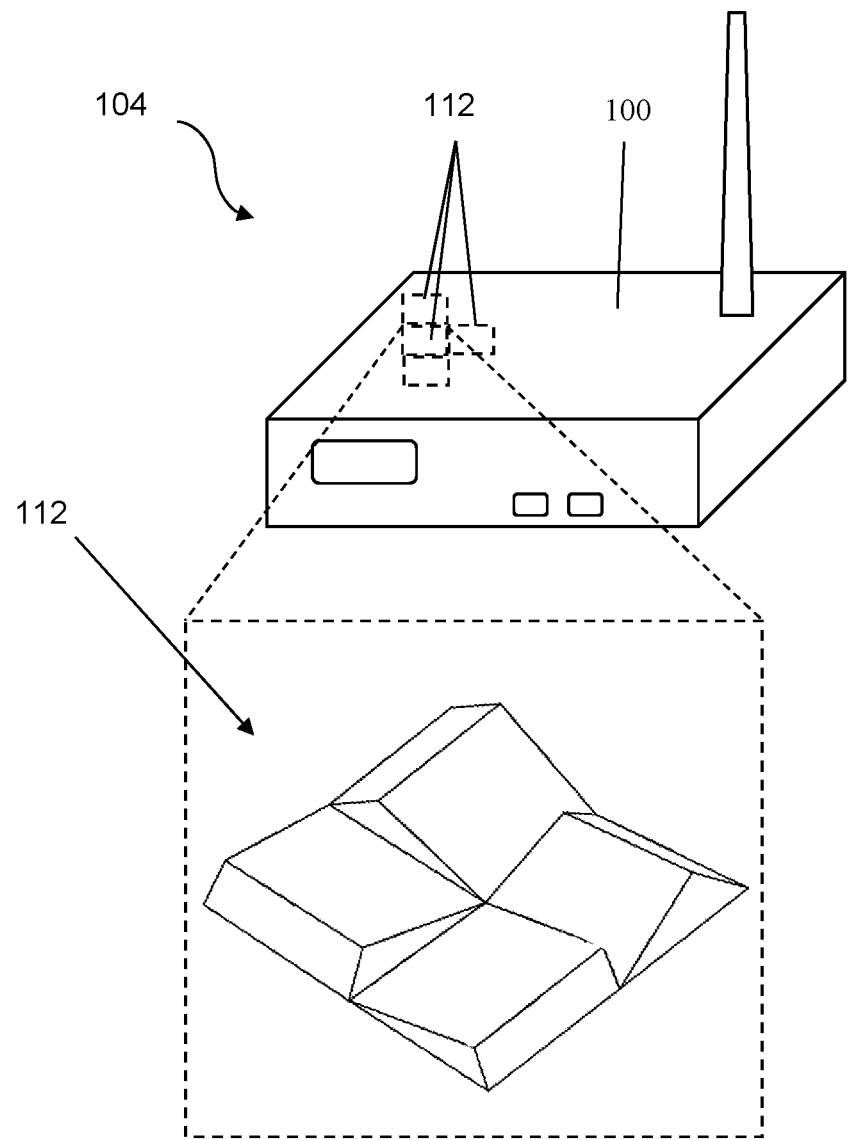
FIG. 1 shows an exemplary media communication device having a surface configured as an embodiment of the thermally protective structure.
Figure 2:
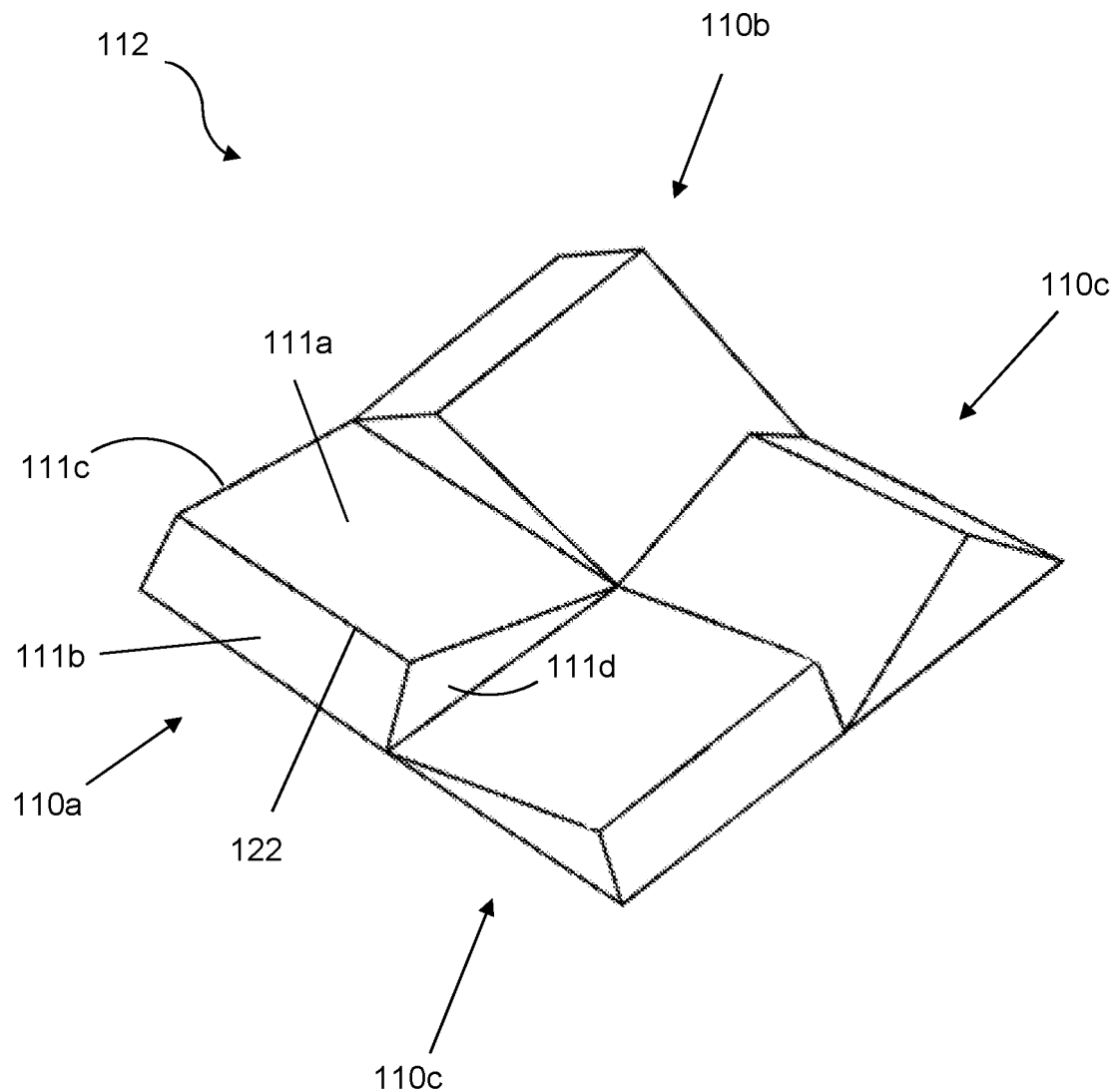
FIG. 2 shows an exemplary subdivision of the thermally protective structure having four wedge-shaped formations.
Figure 3A:
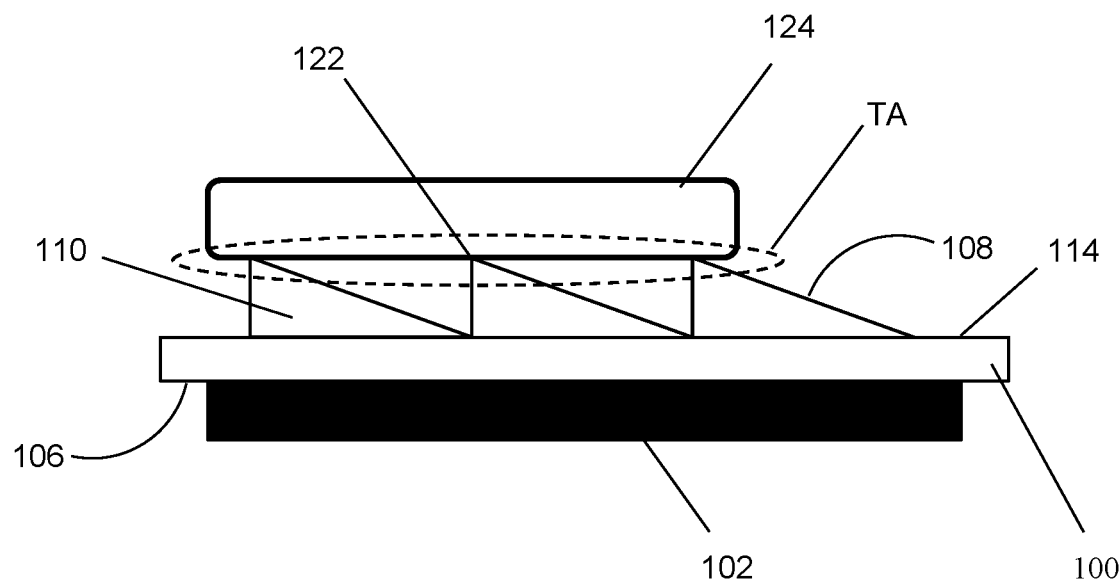
FIGS. 3A and 3B a touch surface created by exemplary formations.

Referring to FIGS. 1-3, embodiments relate to a thermally protective structure 100. The thermally protective structure 100 can be a barrier, a case, housing, enclosure, etc. placed adjacent a heat source 102. For instance, the thermally protective structure 100 can be a case 100 or enclosure, or at least a portion thereof, of a media communication device 104 (e.g., set-top box). The thermally protective structure 100 is fabricated from a rigid material, such as metal, plastic, polymer, etc. The thermally protective structure 100 has an inner surface 106 and an outer surface 108. It is contemplated for the thermally protective structure 100 to be placed adjacent a heat source 102 so that the inner surface 106 faces the heat source 102. The outer surface 108 has a surface area (SA) through which heat transferring from the heat source 102 and into the thermally protective structure 100 is dissipated. Thus, in the embodiment in which the thermally protective structure 100 is a case 100 for a media communication device 104, the inner surface 106 is the inner-facing side of the case 100 and the outer surface 108 is the outer-facing side of the case 100.

A plurality formations 110 are formed on the outer surface 108. The plurality of formations 110 are configured to increase the surface area of the outer surface 108. Each formation 110 is a structural feature (undulation, angled cut, indentation, recession, raised portion, divot, ridge, etc.) formed in or on the outer surface 108. Without any formations 110, the outer surface 108 is flat (forming a flat geometric plane) and has a surface area (SA). Each formation 110 is shaped to generate at least one facet 111. As each formation 110 has at least one facet 111 (or an additional geometric face), the surface area of the outer surface 108 with the formations 110 increases to (SA+). The formations 110 can be applied on a micro scale, such that they are not very noticeable to the naked eye.

In an exemplary embodiment, the outer surface 108 is segmented into a plurality of subdivisions 112. Each subdivision 112 has a plurality of formations 110. The number and configuration of formations 110 on one subdivision 112 can be the same as or different from the number and configuration of formations 110 on another subdivision 112. The shape and configuration of a formation 110 within a subdivision 112 can be the same as or different from the shape and configuration of another formation 110 on the same subdivision 112.

The exemplary embodiment in FIG. 2 shows a subdivision 112 having four formations 110. Each formation 110 is in the shape of a wedge that extends out from the flat surface 114 of the outer surface 108. For instance, the subdivision 112 has a first wedge-shaped formation 110a, a second wedge-shaped formation 110b, a third wedge-shaped formation 110c, and a fourth wedge-shaped formation 110d. Each wedge-shaped formation 110 has four facets 111. The first facet 111a is the incline plane of the wedge, the second facet 111b is the back-end of the wedge, and the third 111c and fourth 111d facets are the sides of the wedge. The incline plane facet 111a extends up from the flat surface 114 of the outer surface 108 and leads to an apex 122. The back-end facet 111b extends down from the apex 122 to the flat surface 114 of the outer surface 108. The back-end facet 111b can extend down at an angle that is normal to the geometric plane of the flat outer surface 108 or at an angle that is non-normal to the geometric plane of the flat outer surface 108. Each side facet 111c, 111d can be at an angle that is normal to the geometric plane of the flat outer surface 108 or at an angle that is non-normal to the geometric plane of the flat outer surface 108.

In an exemplary embodiment, the incline plane facet 111a of each formation 110 is adjacent a side facet 111c, 111d of another formation 110. For instance, the incline plane facet 111a of the first wedge-shaped formation 110a at the point where it meets the flat outer surface 108 is adjacent a side facet 111c, 111d of the second wedge-shaped formation 110. The incline plane facet 111a of the second wedge-shaped formation 110b at the point where it meets the flat outer surface 108 is adjacent a side facet 111c, 111d of the third wedge-shaped formation 110. The incline plane facet 111a of the third wedge-shaped formation 110c at the point where it meets the flat outer surface 108 is adjacent a side facet 111c, 111d of the fourth wedge-shaped formation 110d. The incline plane facet 111a of the fourth wedge-shaped formation 110d at the point where it meets the flat outer surface 108 is adjacent a side facet 111c, 111d of the first wedge-shaped formation 110a. The FIG. 2 shows each incline plane facet 111a having a rectangular shape, each back-end facet 111b having a rectangular shape, and each side facet 111c, 111d having a triangular shape. Other shapes can be used. For instance, any of the incline plane facets 111a and/or back-end facets 111b can be square-shaped, rectangular-shaped, parallelogram-shaped, trapezoidal-shaped, triangular-shaped, etc.

FIG. 2 shows each formation 110 being abutted against another formation 110. Any one or combination of formations 110 can be abutted against another formation 110 or spaced apart, but still adjacent, another formation 110. Thus, adjacent can mean physically touching or being in close proximity.

The subdivision 112 configuration can be repeated across the entire outer surface 108, or a portion thereof. Alternatively, the configuration of each subdivision 112 can be altered. For instance, the case 100 can have a plurality of subdivisions 112—e.g., a first subdivision, a second subdivision, etc. The first subdivision 112 can have the facet configuration described above and illustrated in FIG. 2. The second subdivision can have the same facet configuration or a different facet configuration. Any one or combination of subdivisions 112 can be abutted against another subdivision 112 or spaced apart, but still adjacent, another subdivision 112. Again, adjacent can mean physically touching or being in close proximity.

In some embodiments, the plurality of formations 110 can provide a touch area (TA) defined by an interface between an object 124 and at least one formation 110 the object 124 makes physical contact with, wherein the touch area (TA) is less than the flat surface area (SA). (See FIGS. 3A and 3B). It is contemplated for each formation 110 to have a facet 111 that is not normal to the flat geometric plane of the outer surface 108, and thus when an object 124 (e.g., a user's hand or finger) makes physical contact with the outer surface 108, the surface area of the interface between the object 124 and the outer surface 108 is less than it would have been if there were no formations 110. In other words, TA<SA.

An important regulatory criteria for fabricating media communication devices 104 (such as set-top boxes 104) is "touch temperature". Touch temperature is a measure of the surface temperature of a set-top box device 104. Regulatory criteria usually include a threshold touch temperature that cannot be exceeded. With a set-top box 104 enclosure having a flat surface, the temperature distribution is nominally the same within localized areas. However, when the surface is contoured, as disclosed herein, a reduction on the accessible surface area can be realized—i.e., the aforementioned touch area can be generated. Providing there are many apexes 122 per square mm relative to the temperature probe/finger surface area, the accessible surface area will generally only consist of the apexes 122. Given that the radiation from the formations 110 will be predominately from the base of the formation 110 and tapering to the top, this will lower the perceived surface temperature.

Figure 5:
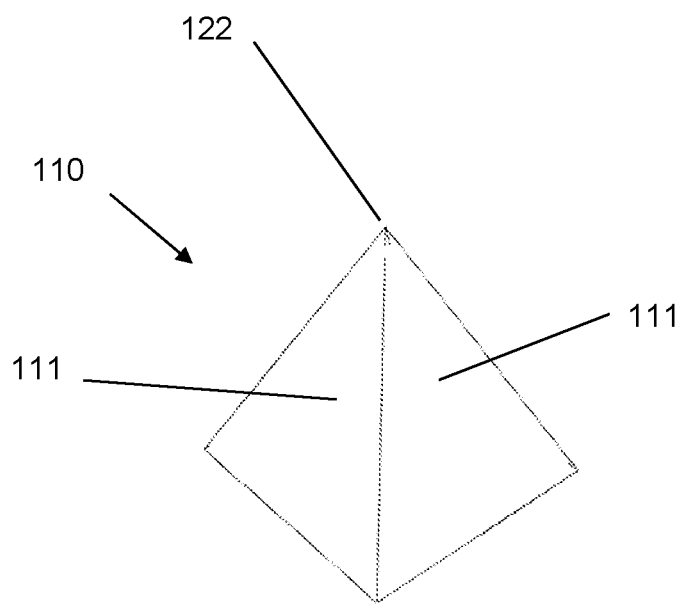
FIG. 5 shows an exemplary pyramid-shaped formation.

It is understood that other shapes, configurations, and number of formations 110 can be used. For instance, FIG. 5 shows another exemplary embodiment of a formation 110. The formation 110 in FIG. 5 is a pyramid shape having four incline facet surfaces 111 leading to an apex 122.

Figure 3B:
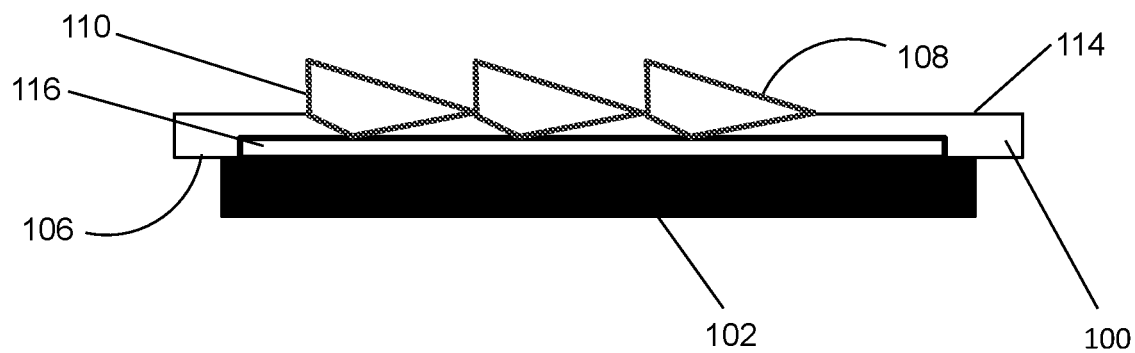

It is also understood that any one or combination of formations 110, or portion thereof, can be formed so as to recess within the outer surface 108, extend out from the outer surface 108, or any combination thereof. For instance, FIG. 3B illustrates an embodiment of a formation 110 that recess within the outer surface 108, the bottom portion (i.e., the base) of the formation 110 can be coupled (e.g., physically touch, in thermal communication or connection with, etc.) to a heat spreader or heat sink within the case 100. For instance, the case 100 can include a thermally protective structure 100 formed on the outer surface 108 and at least one heat spreader (e.g., metal sheet, graphite sheet, etc.) and/or a thermally conductive conduit 116 (e.g., thermal connections) disposed on the inner surface 106 of the case 100. The heat spreader and/or thermally conductive conduit may be coupled to a heat sink. The heat sink can be positioned inside or outside the case 100.

As noted herein, it is contemplated for embodiments of the thermally protective structure 100 to be used as a case 100 or enclosure for a media communication device 104. A media communication device 104 (e.g., a digital image processing device, a set-top box, broadband device, a multimedia device, etc.) has a processor 126 (e.g., integrated circuit) configured to run software (e.g., an operating system) along with other circuitry to facilitate receiving, processing, and transmitting signals. Generally, the media communication device 104 is housed within a case 100 to protect the processor 126 and other circuitry. The processor 126 and/or other circuitry in this system is the heat source 102 and the case 100, or at least a portion thereof, is the thermally protective structure 100. Exemplary embodiments disclose a set-top box 104 as the media communication device 104, but it is understood that the thermally protective structure 100 can be used with other types of media communication devices 104. It is further understood that the thermally protective structure 100 can be used in any system (not just a media communication device) in which protection from heat being generated by a heat source 102 is desired.

A set-top box 104 is an information appliance device configured to convert a source signal (e.g., a signal representing a digital image) into content that can be displayed on a display (e.g., a television display screen). Set-top boxes 104 can be configured for use with cable television systems, satellite television systems, internet television systems, over-the-air television systems, etc. Set-top box 104 is the generic term to encompass "cable boxes", "satellites boxes", "telco boxes", etc. The set-top box 104 can also include, or be in connection with, transceivers, gateways, modems, etc. to facilitate data and transmission/reception, processing, storing, etc. to and from other processing devices, displays, etc. In some embodiments, the set-top box 104 can be configured to act as a network node equipped to interface with another communication device operating on a communication protocol that differs from the communication protocol it is operating on. This can facilitate the set-top box 104 communicating over a communication network so as to permit it to receive software and/or firmware updates from the other communication device. Thus, the set-top box 104 can act as a network node equipped to interface with another communication device such that the set-up box 104 receives software packages or software package updates from the communication device.

Figure 4:
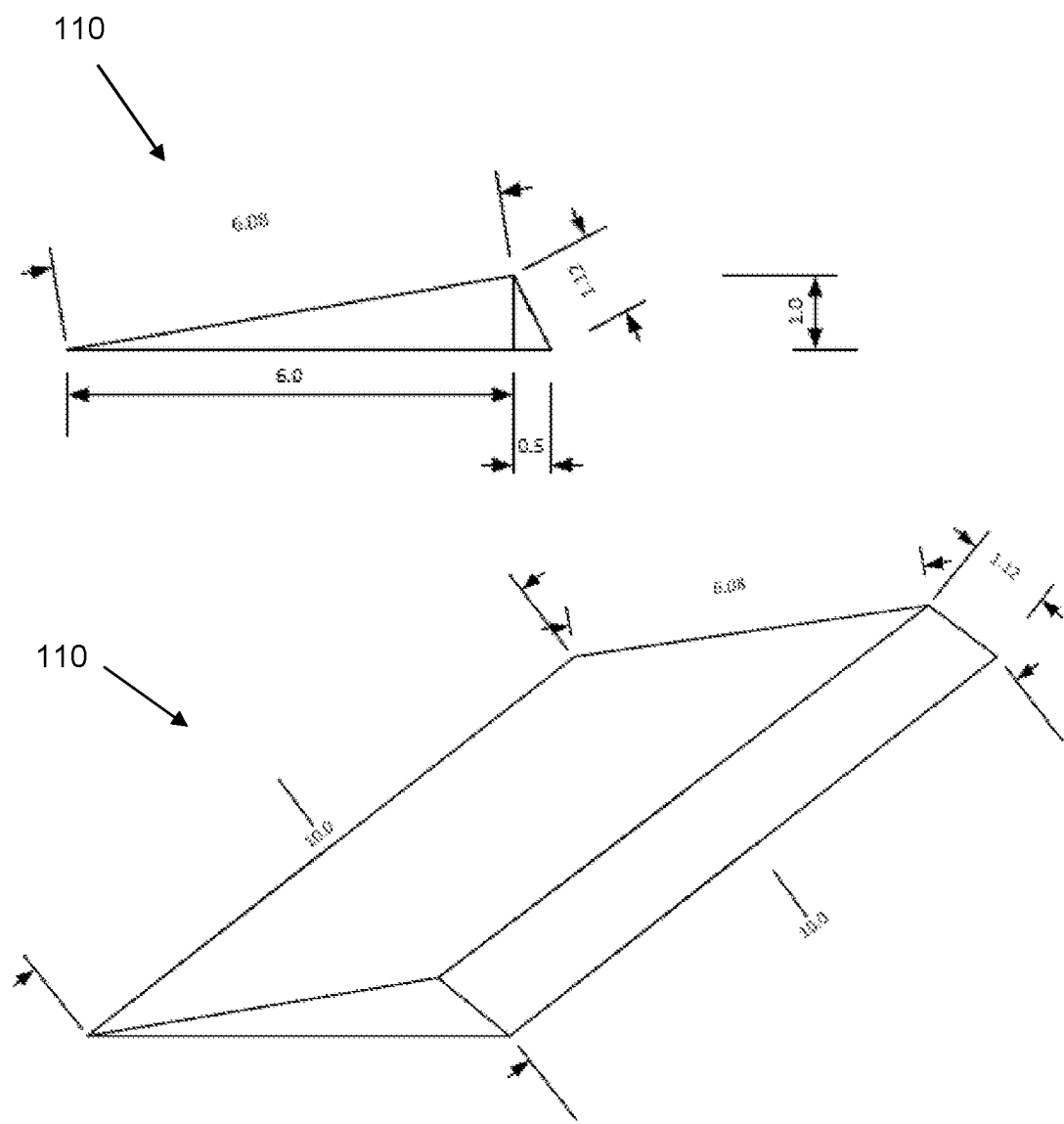
FIG. 4 shows a side view and a top-perspective view of an exemplary wedge-shaped formation.

Referring to FIG. 4, an exemplary set-top box 104 can have the following dimensions: 100 mm×65 m×10 mm. Any one or combination of the surfaces (e.g., the top surface) of the set-top box 104 can be used as the thermally protective structure 100 by segmenting it into a plurality of subdivisions 112. Each subdivision 112 can be 10 mm×6.5 mm, for example. Each subdivision 112 can have four formations 110, each having an apex 122 that extends 1 mm from the flat surface portion of the outer surface 108. Each subdivision 112 can have the formation 110 configuration described in the FIG. 2 embodiment. The incline plane facet 111*a* of each formation 110 can be 10.0 mm×6.08 mm. The back-end facet 111*b* of each formation 110 can be 10.0 mm×1.12 mm. Each side facet 111*c*, 111*d* of each formation 110 can have a triangular base=6.5 mm, a triangular leg=1.12 mm, and a triangular hypotenuse=6.08 mm. The surface area of the flat top surface is SA=65 mm$^2$, whereas the surface area of the faceted top surface is SA+=78.51 mm$^2$. This translates into a 20.78% increase in surface area.

It should be understood that the dimensions described above are exemplary for the specific geometric formation described. Other raised or recessed geometric formations are contemplated herein and may have various dimensions, all of which being configured to increase the surface area.

It is understood that the smaller the formation 110, the more effective the increase in surface area. In addition, with smaller formations 110, the overall ornamentation at a macroscopic level becomes basically unperceivable to the naked eye.

Figure 6:
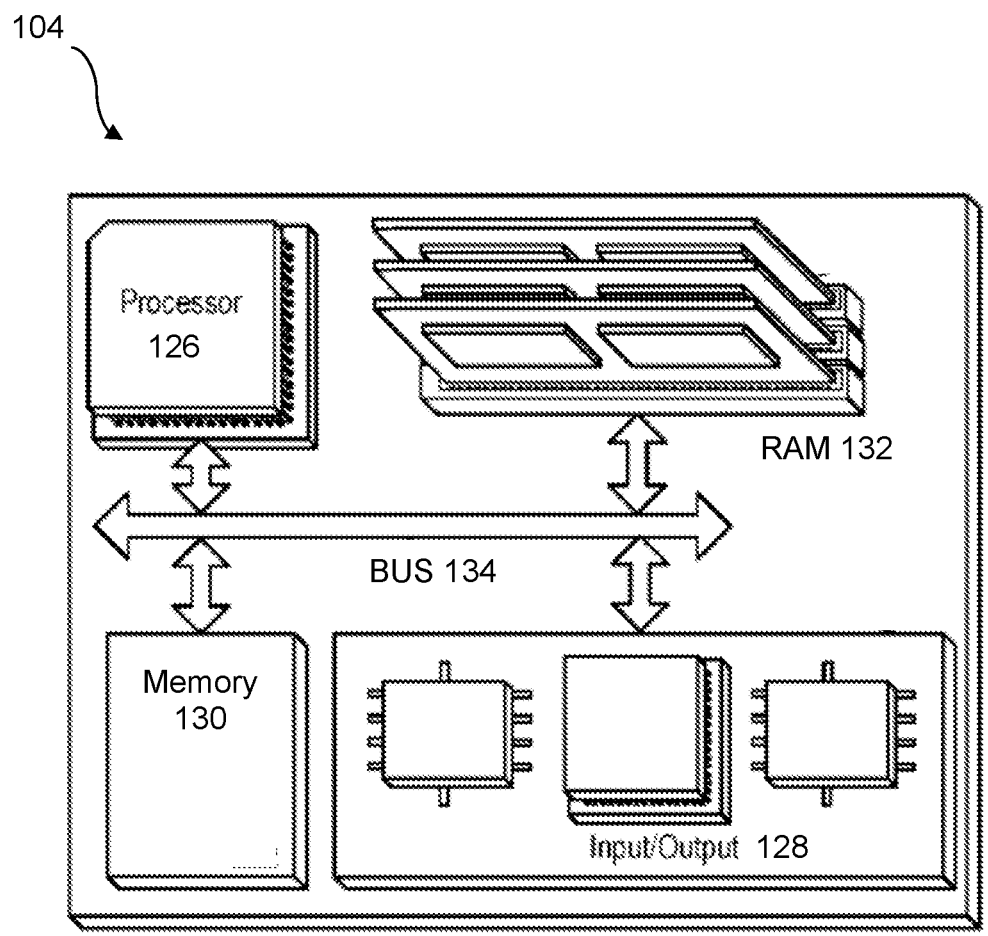
FIG. 6 shows an exemplary hardware architecture for an embodiment of the media communication device.

Referring to FIG. 6, embodiments of the media communication device 104 can be configured to act as a network node equipped to interface with another communication device. FIG. 6 shows an exemplary architecture for the media communication device 104. The media communication device 104 can include an input/output device 128 configured to provide input/output operations for the media communication device 104. In some embodiments, the input/output device 128 can include driver devices configured to receive input data and send output data to another communication device, as well as send communications to, and receive communications from, various networks.

The media communication device 104 can include the processor 126, memory 130, a RAM memory 132, and the input/output device 128. Each of these components can, for example, be interconnected using a system bus 134. The processor 126 is capable of processing instructions for execution within the media communication device 104. The processor 126 can be a single-threaded processor or a multi-threaded processor. The processor 126 is capable of processing instructions stored in the memory 130 or on the RAM memory 132. The memory 130 stores information within the media communication device 104. The memory 130 can include a computer-readable medium, a volatile memory unit, a non-volatile memory unit, etc. The RAM memory 132 is capable of providing mass storage for the media communication device 104.

The media communication device 104, and components thereof, can be realized by instructions that, upon execution, cause one or more processing devices to carry out the processes and functions embedded in software stored within the memory 130 or RAM memory 132. Such instructions can, for example, comprise interpreted instructions, such as script instructions, e.g., JavaScript or ECMAScript instructions, or executable code, or other instructions stored in a computer readable medium.

Implementations of the subject matter and the functional operations described in this specification can be provided in digital electronic circuitry, or in computer software, firmware, or hardware, including the structures disclosed in this specification and their structural equivalents, or in combinations of one or more of them. Embodiments of the subject matter described in this specification can be implemented as one or more computer program products, e.g., one or more modules of computer program instructions encoded on a tangible program carrier for execution by, or to control the operation of, data processing. The tangible program carrier can be a propagated signal or a computer readable medium. The propagated signal is an artificially generated signal, e.g., a machine generated electrical, optical, or electromagnetic signal that is generated to encode information for transmission to suitable receiver apparatus for execution by a computer. The computer readable medium can be a machine readable storage device, a machine readable storage substrate, a memory device, a composition of matter effecting a machine readable propagated signal, or a combination of one or more of them.

The term "processor" encompasses all apparatus, devices, and machines for processing data, including by way of example a programmable processor, a computer, or multiple processors or computers. The processor can include, in addition to hardware, code that creates an execution environment for the computer program in question (e.g., code that constitutes processor firmware, a protocol stack, a database management system, an operating system, or a combination of one or more of them).

A computer program (also known as a program, software, software application, script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer (or processor) or on multiple computers (or multiple processors) that are located at one site or distributed across multiple sites and interconnected by a communication network.

The processes and logic flows described in this specification are performed by one or more programmable processors executing one or more computer programs to perform functions by operating on input data and generating output thereby tying the process to a particular machine (e.g., a machine programmed to perform the processes described herein). The processes and logic flows can also be performed by, and the device can also be implemented as, special purpose logic circuitry, e.g., an FPGA (field programmable gate array), an ASIC (application specific integrated circuit), etc.

Processors suitable for the execution of a computer program include, by way of example, both general and special purpose microprocessors (general microprocessors being transformed into special purpose microprocessor through the application of algorithms described herein), and any one or more processors of any kind of digital computer. Generally, a processor will receive instructions and data from a read only memory or a random access memory or both. The elements of a computer typically include a processor for performing instructions and one or more memory devices for storing instructions and data. Generally, a computer will also include, or be operatively coupled to receive data from or transfer data to, or both, one or more mass storage devices for storing data (e.g., magnetic, magneto optical disks, or optical disks). However, a computer need not have such devices. Moreover, a computer can be embedded in another device (e.g., a mobile communications device, a phone, a cable modem, a set-top box, a mobile audio or video player, or a game console, to name just a few).

Computer readable media suitable for storing computer program instructions and data include all forms of non-volatile memory, media and memory devices, including by way of example semiconductor memory devices, e.g., erasable programmable read-only memory (EPROM), electronically erasable programmable read-only memory (EEPROM), and flash memory devices; magnetic disks, e.g., internal hard disks or removable disks; magneto optical disks; and CD ROM and DVD ROM disks. The processor and the memory can be supplemented by, or incorporated in, special purpose logic circuitry.

To provide for interaction with a user, embodiments of the subject matter described in this specification can be operable to interface with a computing device having a display, e.g., a LCD (liquid crystal display) monitor, for displaying information to the user and a keyboard and a pointing device (e.g., a mouse or a trackball, remote, or any other device by which the user can provide input to the computer). Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

While this specification contains many specific implementation details, these should not be construed as limitations on the scope of any invention or of what can be claimed, but rather as descriptions of features that can be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features can be described above as acting in certain combinations and even initially claimed as such, one or more features from a claimed combination can in some cases be excised from the combination, and the claimed combination can be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the embodiments described above should not be understood as requiring such separation in all embodiments, and it should be understood that the described program components and systems can generally be integrated together in a single software product or packaged into multiple software products.

Particular embodiments of the subject matter described in this specification have been described. While various exemplary embodiments of the disclosed system and method have been described above it should be understood that they have been presented for purposes of example only, not limitations. It is not exhaustive and does not limit the disclosure to the precise form disclosed. Modifications and variations are possible in light of the above teachings or may be acquired from practicing of the disclosure, without departing from the breadth or scope. For example, the actions recited in the claims can be performed in a different order and still achieve desirable results, unless expressly noted otherwise. As one example, the processes depicted in the accompanying figures do not necessarily require the particular order shown, or sequential order, to achieve desirable results. In some implementations, multitasking and parallel processing can be advantageous.

What is claimed is:

1. A thermally protective structure, comprising:
   a barrier having an inner surface and an outer surface, the outer surface divided into a plurality of subdivision areas, the barrier enclosing a media communication device between the inner surface and the outer surface; and
   a plurality of formations constructed within each subdivision area, each formation being a structural feature having a plurality of facets constructed in or on the outer surface such that the outer surface with the plurality of formations has a surface area greater than a surface area of the outer surface without the plurality of formations, wherein at least a portion of one or more of the plurality of formations is recessed within the outer surface, the recessed portion of the one or more formations being in connection with a thermally conductive conduit disposed on the inner surface of the barrier.

2. The thermally protective structure of claim 1, wherein the plurality of formations within each subdivision area forms a pattern that is repeated throughout every subdivision area.

3. The thermally protective structure of claim 1, wherein at least a portion of a formation is raised from the outer surface.

4. The thermally protective structure of claim 1, wherein the plurality of facets for each formation provides for a wedge-shaped formation.

5. The thermally protective structure of claim 1, wherein the plurality of facets for each formation provides for a pyramid-shaped formation.

6. The thermally protective structure of claim 1, wherein:
   each subdivision area has a first formation, a second formation, a third formation, and a fourth formation; and
   each formation is wedge-shaped having an incline plane facet that extends up from the outer surface and leads to an apex, a back-end facet that extends from the apex to the outer surface; a first side facet; and a second side facet.

7. The thermally protective structure of claim 6, wherein at least one back-end facet extends down at an angle that is normal to a geometric flat plane of the outer surface.

8. The thermally protective structure of claim 6, wherein at least one back-end facet extends down at an angle that is non-normal to a geometric flat plane of the outer surface.

9. The thermally protective structure of claim 6, wherein at least one first side facet and at least one of the second side facet extends down at an angle that is normal to a geometric flat plane of the outer surface.

10. The thermally protective structure of claim 6, wherein at least one first side facet and at least one second side facet extends down at an angle that is non-normal to a geometric flat plane of the outer surface.

11. The thermally protective structure of claim 6, wherein:
    the incline plane facet of the first wedge-shaped formation at the point where it meets the outer surface is adjacent a second side facet of the second wedge-shaped formation;

the incline plane facet of the second wedge-shaped formation at the point where it meets the outer surface is adjacent the second side facet of the third wedge-shaped formation;

the incline plane facet of the third wedge-shaped formation at the point where it meets the outer surface is adjacent the second side facet of the fourth wedge-shaped formation; and the incline plane facet of the fourth wedge-shaped formation at the point where it meets the outer surface is adjacent the second side facet of the first wedge-shaped formation.

12. The thermally protective structure of claim 1, wherein:

the plurality of formations provide a touch area defined by an interface between an object and at least one formation the object makes physical contact with; and the touch area is less than the surface area of the outer surface without the plurality of formations.

13. The thermally protective structure of claim 1, wherein:

each subdivision area has a first formation, a second formation, a third formation, and a fourth formation;

each formation is wedge-shaped having an incline plane facet that extends up from the outer surface and leads to an apex, a back-end facet that extends from the apex to the outer surface; a first side facet; and a second side facet;

the plurality of formation provide a touch area defined by an interface between an object and at least one formation the object makes physical contact with; and the interface between the object and at least one formation the object makes physical contact with consists essentially of the apexes of the plurality of formation.

14. The thermally protective structure of claim 1, wherein the barrier is fabricated from a rigid material including one or more of: a metal, a plastic, and a polymer.

15. The thermally protective structure of claim 1, wherein each of the plurality of formations have a height that extends 1.0 mm above the outer surface of the barrier.

16. An enclosure for a media communication device, comprising:

a case configured to house a processor that generates heat when in operation, the case having an inner surface and an outer surface, the outer surface divided into a plurality of subdivision areas; and a plurality of formations constructed within each subdivision area, each formation being a structural feature having a plurality of facets constructed in or on the outer surface such that the outer surface with the plurality of formations has a surface area greater than a surface area of the outer surface without the plurality of formations, wherein at least a portion of one or more of the plurality of formations is recessed within the outer surface, the recessed portion of the one or more formations being in connection with a thermally conductive conduit disposed on the inner surface of the case.

17. The enclosure for a media communication device of claim 16, wherein the inner surface is configured to face a processor of the media communication device and the outer surface has a surface area through which heat transferring from the processor and into the case is dissipated.

18. A method for providing thermal protection, the method comprising:

positioning a barrier adjacent a heat source, the barrier having an inner surface and an outer surface, the inner surface facing the heat source, the barrier enclosing a media communication device between the inner surface and the outer surface, wherein:

the outer surface is divided into a plurality of subdivision areas; and a plurality of formations is constructed within each subdivision area, each formation being a structural feature having a plurality of facets constructed in or on the outer surface such that the outer surface with the plurality of formations has a surface area greater than a surface area of the outer surface without the plurality of formations, wherein at least a portion of one or more of the plurality of formations is recessed within the outer surface, the recessed portion of the one or more formations being in connection with a thermally conductive conduit disposed on the inner surface of the barrier;

transferring heat from the heat source into the barrier via the inner surface; and dissipating the transferred heat via the outer surface.

19. The method of claim 18, further comprising repeating a formation pattern within a subdivision area throughout every subdivision area.

20. The method of claim 18, wherein at least a portion of a formation is raised from the outer surface.

* * * * *